United States Patent
Ha et al.

(10) Patent No.: US 12,029,070 B2
(45) Date of Patent: Jul. 2, 2024

(54) ORGANIC LIGHT EMITTING DISPLAY DEVICE

(71) Applicant: LG DISPLAY CO., LTD., Seoul (KR)

(72) Inventors: Taihyeon Ha, Seoul (KR); DongKyun Lim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 418 days.

(21) Appl. No.: 17/525,274

(22) Filed: Nov. 12, 2021

(65) Prior Publication Data
US 2022/0208893 A1    Jun. 30, 2022

(30) Foreign Application Priority Data

Dec. 24, 2020    (KR) .......................... 10-2020-0183201

(51) Int. Cl.
*H10K 59/00*    (2023.01)
*H04R 1/08*    (2006.01)
*H10K 77/10*    (2023.01)
*H10K 102/00*    (2023.01)

(52) U.S. Cl.
CPC .............. *H10K 59/00* (2023.02); *H04R 1/08* (2013.01); *H10K 77/111* (2023.02); *H04R 2499/15* (2013.01); *H10K 2102/311* (2023.02)

(58) Field of Classification Search
CPC ............... H10K 59/00; H10K 77/111; H10K 2102/311; H10K 59/871; H10K 30/88; H04R 1/08; H04R 2499/15; H04R 9/08; H04R 7/045; H04R 2499/11; H04R 7/04; H04R 9/04; G06F 1/1605; G06F 1/1626; G06F 1/1637; G06F 1/1684; G06F 1/1688
See application file for complete search history.

(56) References Cited

U.S. PATENT DOCUMENTS

2014/0362020 A1*  12/2014  Rothkopf ................ G06F 3/041
                                                           345/173
2020/0212136 A1    7/2020  Ha et al.

FOREIGN PATENT DOCUMENTS

KR    10-2018-0078121 A    7/2018
KR    10-2020-0082013 A    7/2020

* cited by examiner

*Primary Examiner* — Joe E. Schoenholtz
(74) *Attorney, Agent, or Firm* — Morgan, Lewis & Bockius LLP

(57) ABSTRACT

Provided is an organic light emitting display device. The organic light emitting display device includes a display area including a plurality of pixels and a non-display area enclosing the display area, the organic light emitting display device comprises an organic light emitting display panel including a plastic base member, a back plate which is disposed below the organic light emitting display panel and includes a polymer material, a support substrate which is disposed below the back plate and includes a hole formed so as to correspond to a part of the display area, and a microphone module below the support substrate. The microphone module includes a diaphragm which is disposed to overlap at least a part of the hole, a core which is disposed below the diaphragm and is formed of a magnet, and a coil which encloses around the core.

12 Claims, 4 Drawing Sheets

ORGANIC LIGHT EMITTING DISPLAY DEVICE

CROSS-REFERENCE TO RELATED APPLICATIONS

This application claims the priority of Korean Patent Application No. 10-2020-0183201 filed on Dec. 24, 2020, in the Korean Intellectual Property Office, the disclosure of which is incorporated herein by reference.

BACKGROUND

Technical Field

The present disclosure relates to an organic light emitting display device in which a microphone-related device is disposed in a display area.

Discussion of the Related Art

Recently, as it enters an information era, a display field which visually expresses electrical information signals has been rapidly developed and in response to this, various display devices having excellent performances such as thin-thickness, light weight, and low power consumption have been developed. The plastic organic light emitting display device uses a plastic film as a base material instead of a thick glass so that it is light-weight and has an excellent flexibility to be applied to various shapes such as a flexible display.

In the meantime, the display device has a display area in which images are substantially displayed and a bezel area which is a non-display area which is blocked by a light shielding member so that images are not substantially displayed. In the display area, a display element is disposed to display images and in the bezel area, various wiring lines, driving circuits, or the like for driving the display element are disposed. The display includes a camera, a speaker, a microphone, and various sensors to provide various functions and these components are also disposed in the bezel area.

In recent years, in order to make a design of the display beautiful and provide a larger screen in a limited display size as large as possible, studies to reduce the bezel area are actively being conducted. In accordance with this, components such as a camera, a speaker, a microphone, or a sensor which has been disposed in the bezel area in the related art are disposed in the display area, but in order to smoothly display images, a technique which disposes the components in a rear surface of the display is being proposed.

SUMMARY

Accordingly, embodiments of the present disclosure are directed to an organic light emitting display device that substantially obviates one or more of the problems due to limitations and disadvantages of the related art.

An aspect of the present disclosure is to provide an organic light emitting display device including a microphone function by utilizing a display panel.

Another aspect of the present disclosure is to provide a structure for disposing a microphone module and related components in the display area.

Still another aspect of the present disclosure is to dispose a microphone module and related components in a display area to reduce a bezel area of an organic light emitting display device.

Still another aspect of the present disclosure is to provide an organic light emitting display device which is capable of implementing perfect waterproof and dustproof functions.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting display device including a display area including a plurality of pixels and a non-display area enclosing the display area includes an organic light emitting display panel including a plastic base member; a back plate which is disposed below the organic light emitting display panel and includes a polymer material; a support substrate which is disposed below the back plate and includes a hole formed so as to correspond to a part of the display area; and a microphone module below the support substrate, and the microphone module includes a diaphragm which is disposed to overlap at least a part of the hole, a core which is disposed below the diaphragm and is formed of a magnet, and a coil which encloses around the core. By doing this, microphone-related components are disposed in the display area so that the bezel area of the organic light emitting display device is reduced and the hole formed at the outside is removed to implement perfect waterproof and dustproof functions.

Other detailed matters of the exemplary embodiments are included in the detailed description and the drawings.

According to the present disclosure, a microphone module and related components are disposed in a display area so that a bezel area of the organic light emitting display device may be reduced.

According to the present disclosure, all holes formed at the outside are removed to provide the organic light emitting display device having perfect waterproof and dustproof functions.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION OF THE EMBODIMENT

Figure 1:
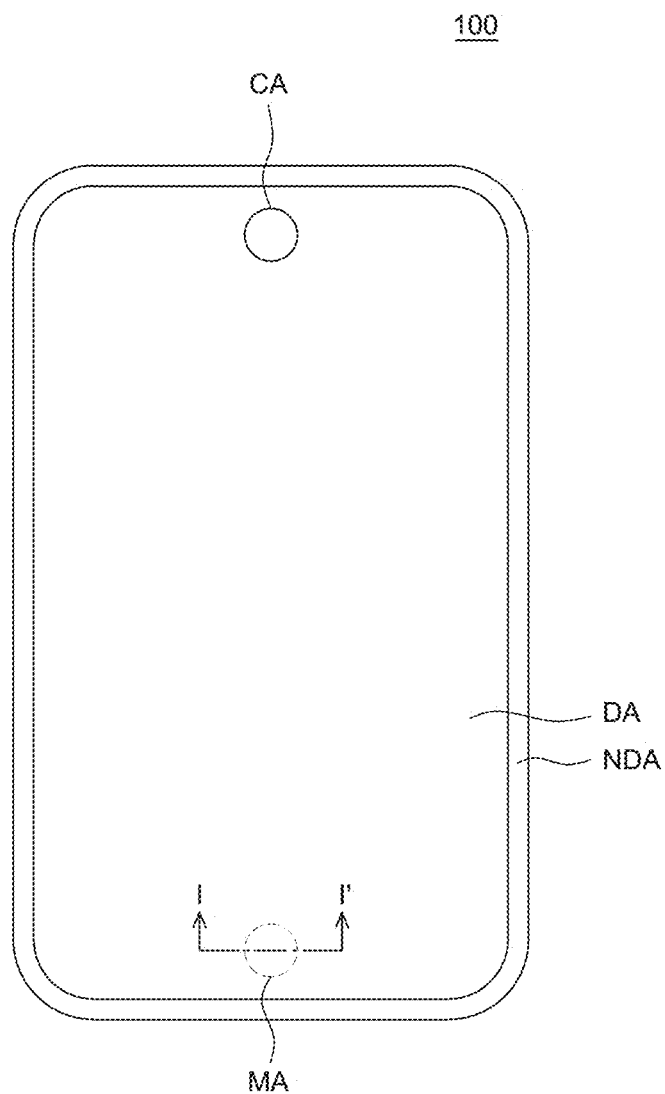
FIG. 1 is a schematic plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an organic light emitting display device according to exemplary embodiments of the present disclosure will be described in detail with reference to accompanying drawings.

Figure 2:
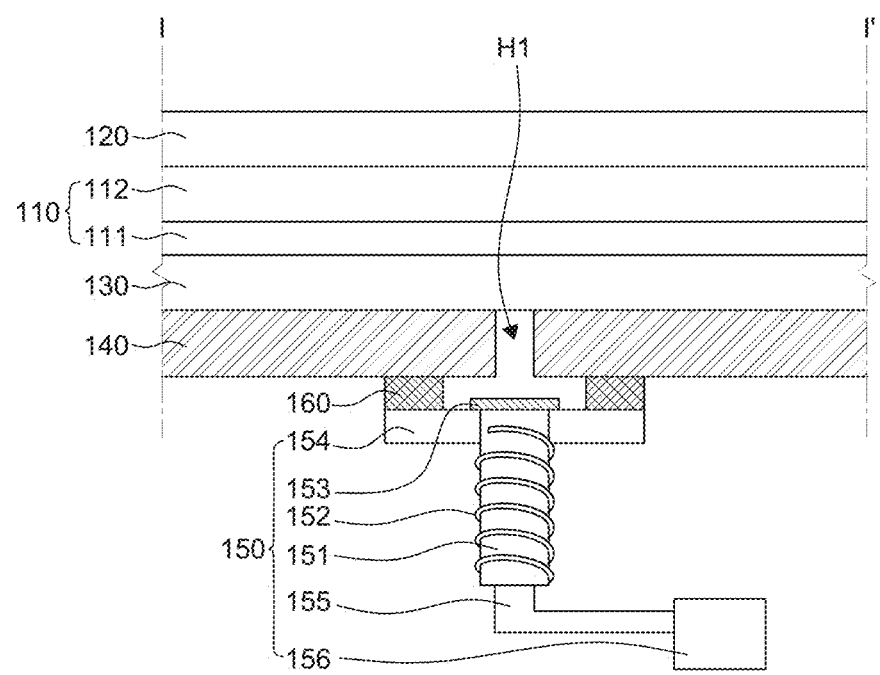
FIG. 2 is a schematic cross-sectional view taken along the line I-I' of FIG. 1.

FIGS. 1 and 2 are views for explaining an organic light emitting display device according to an exemplary embodiment of the present disclosure. FIG. 1 is a schematic plan view of an organic light emitting display device according to an exemplary embodiment of the present disclosure. FIG. 2 is a schematic cross-sectional view taken along the line I-I' of FIG. 1.

Referring to FIGS. 1 and 2, an organic light emitting display device 100 according to an exemplary embodiment of the present disclosure includes an organic light emitting display panel 110, a cover member 120, a back plate 130, a support substrate 140, a microphone module 150, and an adhesive member 160. Hereinafter, individual components will be described in more detail.

First, referring to FIG. 1, the organic light emitting display device 100 is divided into a display area DA and a non-display area NDA. The display area DA is an area where a plurality of sub pixels is disposed to substantially display images. In the display area DA, a plurality of sub pixels for displaying images and various driving elements and driving circuits for driving the sub pixels may be disposed. The sub pixel is an element for displaying one color and includes an emission area in which light is emitted and a non-emission area in which light is not emitted.

The non-display area NDA encloses the display area DA. In the non-display area NDA, images are not substantially displayed and the non-display area is also referred to as a bezel area. Various wiring lines, driving ICs, printed circuit boards, and the like for driving the sub pixels and the driving elements disposed in the display area DA are disposed in the non-display area NDA. For example, in the non-display area, various ICs such as a gate driver IC and a data driver IC may be disposed.

The display area DA includes a camera area CA and a microphone area MA.

The camera area CA is a portion in which a photographic device such as a camera module is disposed below the organic light emitting display panel 110. The camera area CA may be an area in which images may not be displayed and an area having a resolution lower than that of a peripheral area. Specifically, in the camera area CA, an opening is formed so that the sub pixel is not disposed and thus the image may not be displayed. Alternatively, the camera area CA includes a less number of sub pixels than that of the peripheral area in the same area and additionally includes a transmissive area so that the optical transmittance is higher and the resolution is lower than the peripheral area.

The organic light emitting display device 100 includes components such as a camera module, an illuminance sensor, an object and/or biometrics sensor to provide various functions and convenience to a user. The components may be disposed on the rear surface of the plastic base member 111 so as to overlap the camera area CA. The camera area CA has a high optical transmittance so that a camera module and/or various sensors may be disposed therein.

The microphone area MA is a portion in which the microphone module 150 is disposed below the organic light emitting display panel 110. In the microphone area MA, images are displayed and unlike the camera area CA, the image is displayed and the resolution is substantially the same as the peripheral area.

The microphone module 150 which recognizes or records a voice of the user may be disposed on the rear surface of the plastic base member 111 so as to overlap the microphone area MA. At this time, the microphone area MA may be formed in an arbitrary position in the display area.

Positions of the camera area CA and the microphone area MA may be freely changed depending on the design. For example, when the organic light emitting display device 100 according to the exemplary embodiment of the present disclosure is a mobile phone or a tablet PC, as illustrated in FIG. 1, the camera area CA is located at an upper end of the display area DA and the microphone area MA is located at the lower end of the display area DA. However, it is not limited thereto.

In the related art, the camera module, various sensors, the microphone, and the like are disposed in the non-display area NDA so that it is restricted to reduce the non-display area NDA. According to the exemplary embodiment of the present disclosure, the camera area CA having a relatively higher optical transmittance is provided so that the camera module and various sensors may be disposed so as to overlap the camera area CA and the microphone module 150 may be disposed so as to overlap the microphone area MA. Therefore, various components may be disposed so as to overlap the display area so that the non-display area NDA may be reduced.

The organic light emitting display panel 110 is a panel in which images are implemented and includes a plastic base member 111 which supports the component, an organic light emitting diode 112 which implements images, a circuit unit which drives the organic light emitting diode 112, and the like.

The plastic base member 111 supports various elements which configure the organic light emitting display panel 110. The plastic base member 111 is a substrate having a flexibility and may be a polymer material selected from polyimide, polyamide imide, polyethersulfone, polyethylene terephthalate, and polycarbonate, but is not limited thereto. Specifically, polyimide has an excellent mechanical property, specifically, excellent heat resistance so that it does not cause thermal decomposition or thermal deformation even in a high-temperature process of forming components such as thin film transistors on the plastic base member 111. Therefore, the polyimide may be easily used for the plastic base member 111.

The plastic base member 111 has a relatively weak barrier characteristic against moisture or oxygen so that in order to compensate therefor, the plastic base member may have a structure in which a plastic film and an inorganic layer are laminated. For example, the flexible base member may have a multi-layered structure in which a first plastic film, an inorganic layer, and a second plastic film are sequentially laminated, but is not limited thereto.

A driving thin film transistor for driving the organic light emitting diode 112 may be disposed on the flexible base member. The driving thin film transistor may be disposed in each of the plurality of pixel areas. For example, the driving thin film transistor includes a gate electrode, an active layer, a source electrode, and a drain electrode. The driving thin film transistor may further include a gate insulating layer which insulates the gate electrode from the active layer and an interlayer insulating layer which insulates the gate electrode from the source electrode and the drain electrode.

A planarization layer may be disposed on the driving thin film transistor to planarize an upper surface.

The organic light emitting diode 112 is disposed on the planarization layer. The organic light emitting diode 112 may include an anode, a cathode, and an organic light emitting layer disposed therebetween. In the organic light emitting diode 112, holes injected from the anode and electrons injected from the cathode are coupled on the organic light emitting layer to emit light. The image may be displayed using the light emitted as described above.

The cover member 120 is disposed on the organic light emitting diode 112. The cover member 120 protects the organic light emitting display panel 110 from the external impact and scratches. Therefore, the cover member 120 may be formed of a material which is transparent and has excellent impact resistance and scratch resistance. Further, the cover member 120 protects the organic light emitting display panel 110 from the moisture permeating from the outside. When the moisture permeates from the outside, the organic light emitting display panel 110 deteriorates so that the display quality may be degraded.

For example, the cover member 120 may be a film formed of a polymer, such as polyimide, polyamide imide, polyethylene terephthalate, polymethyl methacrylate, polypropylene glycol, and polycarbonate. As another example, the cover member 120 may be a film formed of a photoisotropic polymer such as cycloolefin (co)polymer, photoisotropic polycarbonate, or photoisotropic polymethyl methacrylate.

Further, the cover member 120 may have a multi-layered structure in which various functional layers are laminated. For example, the cover member 120 may include various functional layers such as an external light reflection reducing layer, a UV blocking layer, or a hard coating layer.

The back plate 130 is disposed below the organic light emitting display panel 110. The back plate 130 is disposed below the organic light emitting display panel 110 to support the organic light emitting display panel 110 and protect the organic light emitting display panel 110 from moisture or foreign materials permeating from the outside and external impacts. Further, a thickness of the plastic base member 111 of the organic light emitting display panel 110 is thin so that the back plate 130 is disposed below the plastic base member 111 to suppress the sagging or deformation of the plastic base member 111.

The back plate 130 may be a polymer material selected from polyimide (PI), polymethylmethacrylate (PMMA), polycarbonate (PC), polyvinylalcohol (PVA), acrylonitirlebutadiene-styrene (ABS), polyethylene terephthalate (PET), polycarbonate, silicone, and polyurethane (PU), but is not limited thereto.

The back plate 130 may be formed of the same material as the plastic base member 111 of the organic light emitting display panel 110. As it will be described below, when the microphone module 150 is disposed on a rear surface of the organic light emitting display panel 110, in order to allow a sound to pass through the organic light emitting display panel 110, the base plate 130 and the plastic base member 111 may be formed of a polymer material having a small thickness. For example, the back plate 130 and the plastic base member 111 may be formed of polyimide.

The support substrate 140 is disposed on the rear surface of the back plate 130. The support substrate 140 supports the organic light emitting display panel 110 and is also referred to as a bottom plate. The support substrate 140 may be a metal plate including a metal such as stainless steel SUS, iron Fe, invar, aluminum Al or magnesium Mg. Stainless steel SUS has a high restoring force and rigidity. Therefore, even though the thickness of the support substrate 140 is reduced, the stainless steel may maintain a required mechanical property, such as rigidity, to firmly support the organic light emitting display panel 110.

The support substrate 140 includes at least one hole H1. The hole H1 is formed to correspond to the microphone area MA in the display area DA. The hole H1 serves as a passage through which a sound from a display surface of the organic light emitting display device 100 is transmitted into the organic light emitting display device 100.

The hole H1 may be formed to have various shapes such as a circle, an oval, a semi-circle, or a polygon. For example, in FIG. 1, it is illustrated that the shape of the microphone area MA is a circle and the shape of the hole H1 formed in the support substrate 140 may also be a circle in accordance with the microphone area MA, but is not limited thereto.

In the meantime, the size of the hole H1 may be appropriately adjusted in accordance with a size of the microphone module 150 located below the organic light emitting display panel 110. For example, a size of the hole H1 may be equal to or smaller than or larger than a size of a core 151, a coil 152, or a diaphragm 153 of the microphone module 150. A size of the hole H1 may be appropriately changed in accordance with the size of the microphone module 150 within a range to maintain a rigidity and a function of the support substrate 140. For example, a size of the hole H1 may be 1 mm, but is not limited thereto. The size of the hole H1 will be described below together with the microphone module 150.

The microphone module 150 is disposed below the support substrate 140. The microphone module 150 is disposed below the support substrate 140 so as to correspond to the microphone area MA in the display area DA. The microphone module 150 is disposed so as to overlap at least a part of the hole H1 of the support substrate 140.

The microphone module 150 may be a dynamic type. The dynamic microphone module 150 includes a diaphragm 153, a core 151, and a coil 152. Specifically, referring to FIG. 2, the microphone module 150 of the organic light emitting display device 100 according to the exemplary embodiment of the present disclosure includes an electromagnet configured by the core 151 and the coil 152, the diaphragm 153, the support unit 154, and the host system 156. The electromagnet is located below the organic light emitting display panel 110, the diaphragm 153 is disposed between the organic light emitting display panel 110 and the electromagnet, and the support unit 154 is disposed to enclose the electromagnet and the diaphragm 153 to accommodate and support the microphone module 150.

Specifically, the diaphragm 153 is located below the organic light emitting display panel 110 so as to be opposite to the hole H1 of the support substrate 140 to which the sound is transmitted. The diaphragm 153 may be implemented by a flat panel or a film which vibrates by the transmitted sound or vibration of air. In FIG. 2, even though it is illustrated that the diaphragm 153 is in contact with the core 151 therebelow, if necessary, the diaphragm 153 may be disposed to be spaced apart from the core 151.

The electromagnet is formed of a permanent magnet and includes the core 151 which generates a magnetic field and a wire or the coil 152 which is formed of a conductive material. The electromagnet is formed when the coil 152 repeatedly encloses around the core 151.

The diaphragm 153 vibrates by a sound generated from the outside to move the core 151 or the coil 152 connected thereto. When the electromagnet vibrates in a direction perpendicular to the circumference of the core 151, a density of a magnetic flux which passes through the coil 152 changes. Since an electromotive force is generated by a change in the magnetic flux according to Faraday's law, a current flows in the coil 152.

An amplitude and a frequency at which the diaphragm 153 vibrates are changed according to the change in an amplitude and a frequency of the sound generated from the outside. When the amplitude and the frequency at which the diaphragm 153 vibrates are changed, the density of the magnetic flux which passes through the coil 152 and the current flowing in the coil 152 change. The current is output to a host system 156 by means of the wire 155. The host system 156 recognizes the change in the current flowing through the coil 152 as a change in a voice signal to perform the signal processing.

In the meantime, the change of the output current from the microphone module 150 may be minute so that in order to amplify the minute change of the output current, an amplifier may be further included. For example, the amplifier may be configured using a transistor or an operating amplifier.

Referring to FIG. 2, in the organic light emitting display device 100 according to the exemplary embodiment of the present disclosure, the microphone module 150 is disposed below the support substrate 140 so as to overlap the hole H1 formed in the support substrate 140. Specifically, the diaphragm 153 of the microphone module 150 may be larger than a size of the hole H1 so that in this case, the diaphragm 153 may be disposed to be spaced apart from the support substrate 140 and the hole H1. The sound is transmitted from the outside of the organic light emitting display panel 110 by means of the hole H1 formed in the support substrate 140, so that it is desirable to dispose a center of the diaphragm 153 so as to correspond to the center of the hole H1.

The adhesive member 160 is disposed between the support substrate 140 and the microphone module 150. The adhesive member 160 connects the support substrate 140 and the microphone module 150. Specifically, the adhesive member 160 is disposed to be in contact with a top surface of the support unit 154 of the microphone module 150 and a bottom surface of the support substrate 140.

The adhesive member 160 may perform a buffering function together with an adhering function like a foam pad. That is, the adhesive member 160 alleviates an impact which is applied to the organic light emitting display panel 110 from the outside to minimize the vibration caused by the impact, other than the sound generated from the outside, from being transmitted to the microphone module 150.

The back cover which supports the organic light emitting display panel 110 may be disposed below the organic light emitting display panel 110. The back cover is a case member which accommodates and protects other components including the back plate 130 and the support substrate 140 of the organic light emitting display device 100. The back cover may be configured by a high strength metal material to stably support the organic light emitting display panel 110, but is not limited thereto.

The back cover may be formed to have a rectangular frame with bent edges. Specifically, the back cover may include a horizontal portion and a vertical portion. The horizontal portion is a plate structure corresponding to a shape of the organic light emitting display panel 110 and supports a rear surface of the organic light emitting display panel 110. The vertical portion is opposite to the rear surface of the organic light emitting display panel 110. The vertical portion upwardly extends from an end of the horizontal portion to cover a side surface of the organic light emitting display panel 110. The vertical portion may vertically extend from the end of the horizontal portion, but is not limited thereto. The vertical portion may be disposed to enclose the corner of the organic light emitting display panel 110.

In the meantime, even though not illustrated in FIG. 2, the components may be closely adhered and attached by means of the adhesive layer. For example, an adhesive layer which is formed of an adhesive may be disposed between the cover member 120 and the organic light emitting display panel 110, between the organic light emitting display panel 110 and the back plate 130, and between the back plate 130 and the support substrate 140.

Generally, in the display device including a display panel such as a mobile phone or a tablet PC, the microphone module and the related devices are disposed in the bezel area or a side surface of the display device. Specifically, in order to transmit a sound generated from the outside to the microphone module, a hole through which a sound and a vibration can be transmitted needs to be formed. When this hole is formed in the display area and the display panel, the function of the display panel deteriorates and the aesthetics is impaired. For this reason, the microphone module and the hole need to be disposed in the bezel area or the non-display area of the display device so that it is limited to improve the design of the display device by minimizing a bezel. In addition, there was a limitation in implementing the waterproof and dustproof functions of the display device due to the hole exposed to the outside in order to transmit sound to the microphone module.

The organic light emitting display device 100 according to the exemplary embodiment of the present disclosure includes the organic light emitting display panel 110 including a plastic base member 111 which has a significantly thin thickness and is formed of a polymer material. Further, the organic light emitting display device 100 includes the back plate 130 which supports the organic light emitting display panel 110 and is disposed below the organic light emitting display panel 110 and is formed of a polymer material to support the organic light emitting display panel 110 and protect the organic light emitting display panel 110 from moisture, foreign materials, and external impacts. The organic light emitting display panel 110 and the back plate 130 are configured by a polymer material such as polyimide which is thin and transmits the sound so that the sound generated from the outside of the organic light emitting display panel 110 is transmitted into the organic light emitting display panel 110. Using them, the hole H1 is formed in the support substrate 140 which is formed of a metal and disposed below the back plate 130 so as to overlap a part of the display area DA and the microphone module 150 is disposed below the hole H1. Therefore, the sound generated from the outside of the organic light emitting display device 100 may pass through the organic light emitting display panel 110 and the back plate 130 and may be transmitted to the microphone module 150 by means of the hole H1 of the support substrate 140.

By doing this, the organic light emitting display device 100 according to the exemplary embodiment of the present disclosure may remove the hole which is formed to be exposed to the outside of the display device to transmit the sound generated from the outside of the organic light emitting display device 100 to the microphone. Accordingly, the waterproof and dustproof functions of the display device may be significantly improved. Further, the organic light emitting display device 100 according to the exemplary embodiment of the present disclosure may dispose the microphone module 150 below the organic light emitting display panel 110 in the display area DA. By doing this, a size of the bezel area or the non-display area may be significantly reduced.

Figure 3:
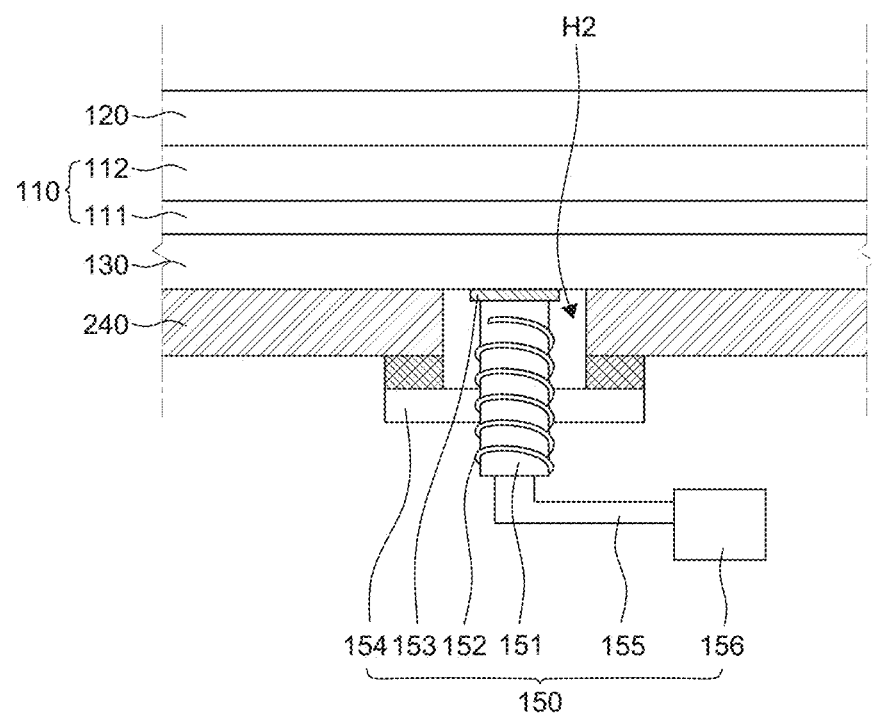
FIG. 3 is a schematic enlarged cross-sectional view of an organic light emitting display device according to another exemplary embodiment of the present disclosure.

FIG. 3 is a schematic enlarged cross-sectional view of an organic light emitting display device 100 according to another exemplary embodiment of the present disclosure. Except for a shape of a hole H2 and a placement structure of a microphone module 250, an organic light emitting display device 200 illustrated in FIG. 3 is substantially the same as the organic light emitting display device 100 illustrated in FIGS. 1 to 2. Therefore, a description of repeated components will be omitted.

Referring to FIG. 3, a size of the hole H2 formed in a support substrate 240 is larger than a diaphragm 153 of the microphone module 250. By doing this, the diaphragm 153 of the microphone module 250 may be disposed in the hole H2. In addition, an electromagnet including a core 151 and a coil 152 of the microphone module 250 may also be disposed in the hole H2. The organic light emitting display device 200 illustrated in FIG. 3 has the diaphragm 153 of the microphone module 250 or a structure in which the diaphragm 153 and the electromagnet are inserted into the hole H2 of the support substrate 240 so that the thickness of the entire organic light emitting display device 200 may be reduced. Further, in the organic light emitting display device 200 illustrated in FIG. 3, the diaphragm 153 is disposed to be closer to the organic light emitting display panel 110 and the back plate 130 so that the sound and the vibration transmitted from the outside are more clearly recognized. Therefore, the sensitivity of the microphone may be significantly improved.

As illustrated in FIG. 3, when the diaphragm 153 is in direct contact with the lower surface of the back plate 130, it is advantageous in that the sensitivity of the microphone is significantly improved. However, the external impact is directly transmitted so that it is more easily used for a display device which does not require touch input. In the meantime, even though in FIG. 3, a structure in which the diaphragm 153 is in contact with a lower surface of the back plate 130 is illustrated, the diaphragm 153 may be spaced apart from the back plate 130 with a predetermined distance.

Figure 4:
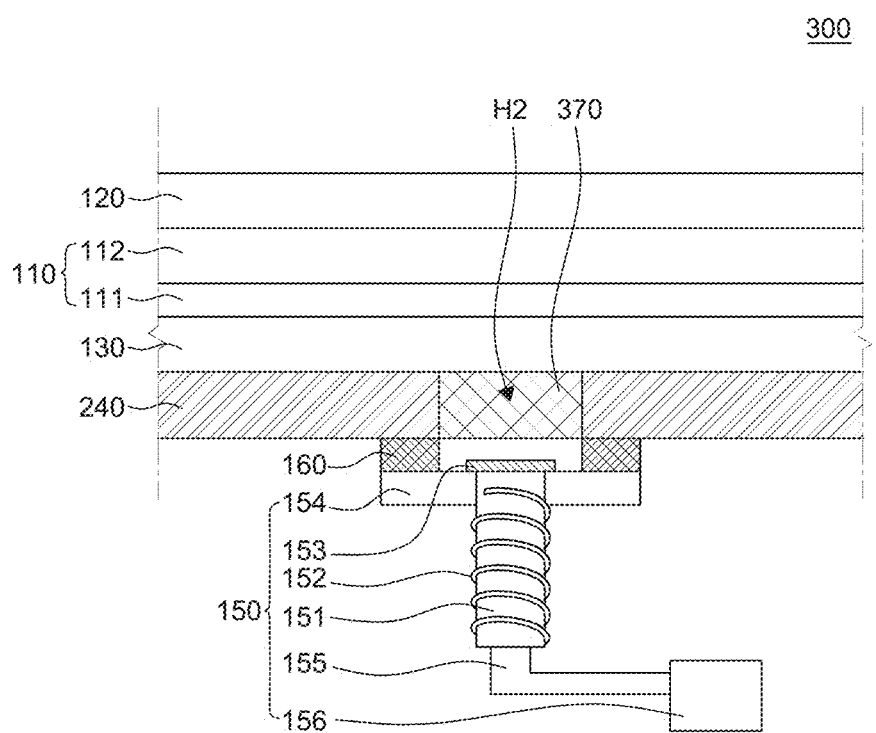
FIG. 4 is a schematic enlarged cross-sectional view of an organic light emitting display device according to still another exemplary embodiment of the present disclosure.

FIG. 4 is a schematic enlarged cross-sectional view of an organic light emitting display device according to still another exemplary embodiment of the present disclosure. An organic light emitting display device 300 illustrated in FIG. 4 is substantially the same as the organic light emitting display device 200 illustrated in FIG. 3 except that a metal pattern unit is further provided and a placement structure of the microphone module 150 is changed. Therefore, a description of repeated components will be omitted.

Referring to FIG. 4, a metal filler 370 including pores is disposed in the hole H2 formed in the support substrate 240. The metal filler 370 may improve impact resistance while maintaining a sensitivity of the microphone. Specifically, the metal filler 370 may transmit the external sound to the microphone module 150 through the pores and components above the hole H2 may be supported and the impact from the outside may be dispersed by the metal material which configures the metal filler 370.

The metal filler 370 may be a metal structure including a pattern which forms pores or a metal fiber including pores.

The metal structure may include one or more metals selected from stainless steel, titanium, and aluminum. Further, the metal structure may be formed of the same material as the support substrate 240 and formed to be integrated with the support substrate 240. In this case, the metal filler 370 may be formed by forming a pattern in the groove of the support substrate 240.

The metal structure includes a pattern which forms pores. The metal structure is not specifically limited as long as it is a structure in which a plurality of supports is disposed with a pattern to form pores. For example, the metal structure may be a honeycomb pattern structure, a triangle pattern structure, or a truss structure, but is not limited thereto.

The metal fiber may include one or more metals selected from stainless steel, titanium, and aluminum. Such metal materials do not easily undergo plastic deformation and have excellent rigidity. To be more specific, the metal fiber may be formed of a metallic yarn or a metal fiber sheet. For example, the metallic yarn may be processed to have a predetermined thickness and length by performing a stretching process on the metal fiber. For example, the metallic yarn may be formed by stretching a single metal fiber. As another example, the metallic yarn may have a twisted structure by twisting a single metal fiber in a predetermined direction or have a twisted structure by twisting a plurality of single metal fibers.

The metallic yarn is filled in the hole H2 to form a structure in which the metal fiber is randomly entangled. As the metal fiber is randomly entangled, an irregular network structure is formed. Therefore, the metal filler 370 disposed the hole H2 is formed to have a porous structure including a plurality of pores.

As illustrated in FIG. 4, when the metal filler 370 including pores is disposed in the hole H2 of the support substrate 140, an excellent recording quality is satisfied and the impact from the outside is alleviated to improve the impact resistance.

The exemplary embodiments of the present disclosure can also be described as follows:

According to an aspect of the present disclosure, there is provided an organic light emitting display device. The organic light emitting display device includes a display area including a plurality of pixels and a non-display area enclosing the display area, the organic light emitting display device comprises an organic light emitting display panel including a plastic base member, a back plate which is disposed below the organic light emitting display panel and includes a polymer material, a support substrate which is disposed below the back plate and includes a hole formed so as to correspond to a part of the display area, and a microphone module below the support substrate. The microphone module includes a diaphragm which is disposed to overlap at least a part of the hole, a core which is disposed below the diaphragm and is formed of a magnet, and a coil which encloses around the core.

The plastic base member and the back plate may include polyimide.

A center of the diaphragm and a center of the hole may match.

A size of the hole may be smaller than a size of the diaphragm and the diaphragm may be disposed to be spaced apart from the hole with a predetermined distance.

A size of the hole may be larger than a size of the diaphragm and the diaphragm may be disposed in the hole.

The diaphragm may be disposed to be in direct contact with a lower surface of the back plate.

The organic light emitting display device may further comprise a metal filler which is disposed in the hole and includes pores.

The metal filler may be a metal structure including a pattern for forming pores.

The metal structure may be formed of any one of a honeycomb pattern structure, a triangle pattern structure, and a truss structure, which are integrally formed with the support substrate.

The metal filler may be a metal fiber which includes a metallic yarn or a metal fiber sheet.

The microphone module may be a dynamic type.

The microphone module may further include a support unit which encloses and supports the core, the coil, and the diaphragm, and a foam pad disposed between the support substrate and the support unit in the vicinity of the hole.

It will be apparent to those skilled in the art that various modifications and variations can be made in the organic light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device including a display area including a plurality of pixels and a non-display area enclosing the display area, the organic light emitting display device comprising:
    an organic light emitting display panel including a plastic base member;
    a back plate which is disposed below the organic light emitting display panel and includes a polymer material;
    a support substrate which is disposed below the back plate and includes a hole formed so as to correspond to a part of the display area; and
    a microphone module below the support substrate,
    wherein the microphone module includes a diaphragm which is disposed to overlap at least a part of the hole, a core which is disposed below the diaphragm and is formed of a magnet, and a coil which encloses around the core.

2. The organic light emitting display device according to claim 1, wherein the plastic base member and the back plate include polyimide.

3. The organic light emitting display device according to claim 1, wherein a center of the diaphragm and a center of the hole match.

4. The organic light emitting display device according to claim 1, wherein a size of the hole is smaller than a size of the diaphragm and the diaphragm is disposed to be spaced apart from the hole with a predetermined distance.

5. The organic light emitting display device according to claim 1, wherein a size of the hole is larger than a size of the diaphragm and the diaphragm is disposed in the hole.

6. The organic light emitting display device according to claim 5, wherein the diaphragm is disposed to be in direct contact with a lower surface of the back plate.

7. The organic light emitting display device according to claim 1, further comprising:
    a metal filler which is disposed in the hole and includes pores.

8. The organic light emitting display device according to claim 7, wherein the metal filler is a metal structure including a pattern for forming pores.

9. The organic light emitting display device according to claim 8, wherein the metal structure is formed of any one of a honeycomb pattern structure, a triangle pattern structure, and a truss structure, which are integrally formed with the support substrate.

10. The organic light emitting display device according to claim 7, wherein the metal filler is a metal fiber which includes a metallic yarn or a metal fiber sheet.

11. The organic light emitting display device according to claim 1, wherein the microphone module is a dynamic type.

12. The organic light emitting display device according to claim 1, wherein the microphone module further includes a support unit which encloses and supports the core, the coil, and the diaphragm, and a foam pad disposed between the support substrate and the support unit in the vicinity of the hole.

* * * * *